(12) United States Patent
Doyle

(10) Patent No.: US 8,131,046 B2
(45) Date of Patent: Mar. 6, 2012

(54) MAGNETIC RESONANCE IMAGER USING CYLINDRICAL OFFSET REGION OF EXCITATION, AND METHOD

(75) Inventor: Mark Doyle, Wexford, PA (US)

(73) Assignee: Allegheny-Singer Research Institute, Pittsburgh, PA (US)

( * ) Notice: Subject to any disclaimer, the term of this patent is extended or adjusted under 35 U.S.C. 154(b) by 675 days.

(21) Appl. No.: 12/290,330

(22) Filed: Oct. 29, 2008

(65) Prior Publication Data

US 2010/0104157 A1    Apr. 29, 2010

(51) Int. Cl.
*G06K 9/00* (2006.01)
(52) U.S. Cl. ......... 382/131; 382/154; 382/171; 382/173
(58) Field of Classification Search ............... 382/131, 382/154, 171, 173
See application file for complete search history.

(56) References Cited

U.S. PATENT DOCUMENTS

| | | | |
|---|---|---|---|
| 4,310,799 A | 1/1982 | Hutchison et al. |
| 4,727,327 A | 2/1988 | Toyoshima et al. |
| 4,829,252 A | 5/1989 | Kaufman |
| 4,973,906 A | 11/1990 | Bernstein |
| 5,034,692 A | 7/1991 | Laub et al. |
| 5,160,889 A | 11/1992 | Scheidegger et al. |
| 5,204,627 A | 4/1993 | Mistretta et al. |
| 5,305,749 A | 4/1994 | Li et al. |
| 5,417,213 A | 5/1995 | Prince |
| 5,525,904 A | 6/1996 | Hanley et al. |
| 5,668,474 A | 9/1997 | Heid |
| 5,713,358 A | 2/1998 | Mistretta et al. |

(Continued)

FOREIGN PATENT DOCUMENTS

EP    0430104 A2    6/1991

(Continued)

OTHER PUBLICATIONS

Gurr, D. H. et al., "Polar Phase Encode Placement for 3D Acquisition with time-resolved projections", Proceedings of the International Society for Magnetic Resonance in Medicine, 11th Scientific Meeting and Exhibition, Toronto, Canada, Jul. 10-16, 2003, Toronto, vol. 11, Jul. 10, 2003, p. 1349.

(Continued)

*Primary Examiner* — Wai Sing Louie
(74) *Attorney, Agent, or Firm* — Pepper Hamilton LLP

(57) ABSTRACT

A magnetic resonance imager performing images of a patient imager includes imaging coils. The imager includes receiver coils The imager includes a computer that causes the imaging coils to produce a first steady-state free precession excitation slab with respect to a first position regarding a target of the patient during a first repetition time, and a second steady-state free precession excitation slab with respect to a second position different from the first position regarding the target during a second repetition time; and forming a first 3-D dataset of the target associated with the first excitation slab and a second 3-D image dataset of the target associated with the second excitation slab from information received from the receiver coils. The first 3-D image dataset and the second 3-D image dataset, together defining a series of 3-D image datasets for each repetition time; and producing an image of the target from the series of 3-D image datasets. A method for analyzing a patient. A method to evaluate coronary arteries to assess their degree of stenosis. A computer program which, when executed by a computer of a Magnetic Resonance Imager, forms an image of a patient.

11 Claims, 12 Drawing Sheets

U.S. PATENT DOCUMENTS

| | | | |
|---|---|---|---|
| 5,910,728 A | 6/1999 | Sodickson | |
| 6,088,611 A | 7/2000 | Lauterbur et al. | |
| 6,233,475 B1 | 5/2001 | Kim et al. | |
| 6,259,940 B1 | 7/2001 | Bernstein et al. | |
| 6,275,037 B1 | 8/2001 | Harvey et al. | |
| 6,307,368 B1 | 10/2001 | Vasanawala et al. | |
| 6,310,478 B1 | 10/2001 | Heid | |
| 6,487,435 B2 | 11/2002 | Mistretta et al. | |
| 6,630,828 B1 | 10/2003 | Mistretta et al. | |
| 6,771,067 B2 | 8/2004 | Kellman et al. | |
| 6,794,867 B1 | 9/2004 | Block et al. | |
| 6,975,115 B1 | 12/2005 | Fujita et al. | |
| 7,005,853 B2 | 2/2006 | Tsao et al. | |
| 7,020,509 B2 | 3/2006 | Heid | |
| 7,023,207 B1 | 4/2006 | Gaddipati et al. | |
| 7,202,663 B2 | 4/2007 | Huang | |
| 7,245,125 B2 | 7/2007 | Harer et al. | |
| 7,253,620 B1 | 8/2007 | Derbyshire et al. | |
| 7,486,074 B2 | 2/2009 | McKenzie et al. | |
| 7,541,808 B2 | 6/2009 | Doyle | |
| 7,683,614 B2 | 3/2010 | Posse | |
| 7,693,563 B2 | 4/2010 | Suresh et al. | |
| 2003/0166999 A1 | 9/2003 | Liu et al. | |
| 2003/0169043 A1 | 9/2003 | Hoshino | |
| 2004/0051529 A1 | 3/2004 | Zhu et al. | |
| 2004/0254447 A1 | 12/2004 | Block et al. | |
| 2005/0007112 A1 | 1/2005 | Deimling | |
| 2005/0251023 A1 | 11/2005 | Kannengiesser et al. | |
| 2006/0036154 A1 | 2/2006 | Deimling | |
| 2006/0050981 A1 | 3/2006 | Huang | |
| 2006/0067567 A1* | 3/2006 | Hashimoto | 382/131 |
| 2006/0262970 A1* | 11/2006 | Boese et al. | 382/131 |
| 2007/0063701 A1 | 3/2007 | Vu | |
| 2007/0110290 A1 | 5/2007 | Chang et al. | |
| 2007/0159174 A1 | 7/2007 | Oshio | |
| 2007/0242866 A1 | 10/2007 | Schmitt et al. | |
| 2008/0021304 A1 | 1/2008 | Stemmer | |
| 2008/0175458 A1 | 7/2008 | Guo et al. | |
| 2009/0096787 A1* | 4/2009 | Masumoto et al. | 345/424 |
| 2009/0105582 A1 | 4/2009 | Dougherty et al. | |

FOREIGN PATENT DOCUMENTS

| | | |
|---|---|---|
| EP | 0924530 A2 | 6/1999 |
| GB | 2034123 A | 5/1980 |
| JP | 06 237910 A | 8/1994 |
| WO | 9002344 | 3/1990 |
| WO | 9012329 | 10/1990 |
| WO | WO 91/13367 A1 | 9/1991 |
| WO | WO 94/29741 A1 | 12/1994 |
| WO | WO 2006/120583 A | 11/2006 |

OTHER PUBLICATIONS

Goldfarb, J. W., "Targeted Rotational Magnetic Resonance Angiography(TROTA): 2D Projection Imaging with 3D Reconstruction", Proceedings of the International Society for Magnetic Resonance in Medicine, 12th Scientific Meeting and Exhibition, Kyoto, Japan, May 15-21, 2004, Kyoto, vol. 11, May 15, 2004, p. 2109.

Uribe S. A. et al., "Integration of Magnetization Preparation Sequences into SSFP Sequences: A Fat Saturation Example", Proceedings of the International Society for Magnetic Resonance in Medicine, 16th Scientific Meeting and Exhibition, Toronto, Canada, May 3-9, 2008, Toronto, May 3, 2008, p. 1402.

Lin Hung-Yu et al., "Blood Attenuation with SSFP-Compatible Saturation (BASS)", Journal of Magnetic Resonance Imaging, Society for Magnetic Resonance Imaging, Oak Brook, IL, US, vol. 24, Aug. 4, 2006 pp. 701-707.

Werner R. et al., "Continuous Artery-Selective Spin Labeling (CASSL)", Magnetic Resonance in Medicine, Academic Press, Duluth, MN, US, vol. 53, Apr. 20, 2005, pp. 1006-1012.

Doyle et al, "Block Regional Interpolation Scheme for K-Space (BRISK): A Rapid Cardiac Imaging Technique" 1995, Magnetic Resonance in Medicine, Academic Press (Duluth, MN, US) 33:163-170.

Geier et al. "Parallel Acquisition for Effective Density Weighted Imaging. PLANED Imaging" 2007, Magnetic Resonance Materials in Physics, Biology and Medicine, Chapman and Hall (London, GB) 20(1):19-25).

Kozerke et al. "Accelerating Cardiac Cine 3D Imaging Using k-t BLAST" 2004, Magnetic Resonance in Medicine, Wiley-Liss, Inc. 52:19-26.

Lethmate et al, "Dynamic MR-Imaging with Radial Scanning, a Post-Acquisition Keyhole Approach" 2003, EURASIP J. on app. Signal Processing, Hindawi Publishing Corp. p. 405-412.

Pipe "Reconstructing MR Images From Undersampled Data: Data-Weighting Considerations" 2000, Magnetic Resonance in Medicine, Academic Press (Duluth, MN, US) 43(6):867-875.

Rehwald et al. "Theory of High-Speed MR Imaging o the Human Heart with the Selective Line Acquisition Mode" 2001, Radiology 220(2):540-547.

Tsai et al. "Reduced Alisaing Artifacts using Variable-Density k-Space Sampling Trajectories" 2000, Magnetic Resonance in Medicine, Academic Press (Duluth, MN, US) 43(3);452-458.

Tsao et al. "Eight-fold acceleration in real-time cardiac imaging using k-t BLAST and k-t SENSE with SSFP and segmented EPI" 2003, Proc. Intl. soc. Mag. Reson. Med. 11:209.

Tsao et al. "k-t BLAST and k-t SENSE: Dynamic MRI With High Frame Rate Exploiting Spatiotemporal Correlations" 2003, Magnetic Resonance in Medicine, Wiley-Liss, Inc. 50(5):1031-1042.

Herzka et al. "Myocardial tagging with SSFP" 2003, Magnetic Resonance in Medicine, Academic Press (Duluth, MN, US) 49:329-340 (XP002548177).

Herzka et al. "Multishot EPI-SSFP in the Heart" 2002, Magnetic Resonance in Medicine, Academic Press (Duluth, MN, US) 47(4):655-664 (XP002526274).

Pai "PTAGs: Partial k-space tagging combined with SSFP" 2006, Proceedings of the Int'l Society for Magnetic Resonance in Medicine, 14th Scientific Meeting and Exhibition (Seattle, WA, US) p. 1216 (XP002548176).

Stainsby et al. "Visualizing flow using MR tagging and FIESTA Imaging" 2005, Proceedings of the Int'l Society for Magnetic Resonance in Medicine, 13th Scientific Meeting and Exhibition (Miami Beach, FL, US) p. 2382 (XP002548178).

Witschey et al. "Balanced steady-state free precession spatial gridding" 2008. Proceedings of the Int'l Society for Magnetic Resonance in Medicine, 16th Scientific Meeting and Exhibition (Toronto, Canada) p. 1404 (XP002548175).

Griswold et al. "Autocalibrated coil sensitivity estimation for parallel imaging" 2006, NMR in Biomedicine, Wiley (London, GB) 19:316-324.

Kellman et al. "Adaptive Sensitivity Encoding Incorporating Temporal Filtering (TSENSE)" 2001, Magnetic Resonance in Medicine, Academic Press (Duluth, MN, US) 45(5):846-852

Madore et al. "Unaliasing by Fourier-Encoding The Overlaps Using the Temporal Dimension (UNFOLD), Applied to Cardiac Imaging and FMRI" Magnetic Resonance in Medicine, Academic Press (Duluth, MN, US) 42:813-828, May 18, 1999.

Song et al. "Dynamic MRI with projection reconstruction and KWIC processing for simultaneous high spatial and temporal resolution" 2004, Magnetic Resonance in Medicine, Academic Press (Duluth, MN, US) 52(4):815-824.

Maier et al. "Accurate Velocity Mapping with FAcE" 1996, Magnetic Resonance Imaging, Elsevier Science, Inc. (USA) 14(2):163-171.

\* cited by examiner

DIRECTLY ACQUIRED "HORIZONTAL" SLAB

DIRECTLY ACQUIRED "VERTICAL" SLAB

"HORIZONTAL" SLAB GENERATED BY
ROTATING THE "VERTICAL" SLAB

MAGNETIC RESONANCE IMAGER USING CYLINDRICAL OFFSET REGION OF EXCITATION, AND METHOD

FIELD OF THE INVENTION

The present invention is related to obtaining data with a magnetic resonance imager of each of a plurality of steady-state free precession excitations slabs rotated about a target of a patient. (As used herein, references to the "present invention" or "invention" relate to exemplary embodiments and not necessarily to every embodiment encompassed by the appended claims.) More specifically, the present invention, Cylindrical Offset Region of Excitation (CORE), is related to obtaining data with a magnetic resonance imager of each of a plurality of steady-state free precession excitations slabs during respective repetition times rotated about the target of a patient to obtain a series of 3-D image datasets for each repetition time, and producing an image of the target from the series of 3-D image datasets.

BACKGROUND OF THE INVENTION

This section is intended to introduce the reader to various aspects of the art that may be related to various aspects of the present invention. The following discussion is intended to provide information to facilitate a better understanding of the present invention. Accordingly, it should be understood that statements in the following discussion are to be read in this light, and not as admissions of prior art.

Currently, the widely accepted standard to evaluate coronary arteries to assess their degree of stenosis is to perform catheter based x-ray angiography. This offers projective views of the coronary arteries with an in-plane resolution of approximately $0.1 \times 0.1$ mm$^2$. Alternative technologies to perform coronary artery imaging include tomographic approaches such as MRI and x-ray Computer Tomography (CT). Currently, CT offers tomographic resolution of approximately $0.5 \times 0.5 \times 0.5$ mm$^3$, and MRI offers tomographic resolution of approximately $1 \times 1 \times 1$ mm$^3$ Despite the ability to view the coronary arteries with isotropic resolution, both MRI and CT tomographic approaches have been deemed inferior compared to the current catheter based examination. If tomographic resolution were to be improved to match x-ray angiography, CT would have to improve by a factor of 125 and MRI would have to improve by a factor of 1,000. Clearly, these levels of enhancement would require dramatic improvements in performance. The CORE signal preparation approach can be utilized to allow MRI to produce projective angiographic views of the coronary arteries. In this case, to match conventional x-ray angiography the in-plane resolution has to improve by a factor of 100, which requires high efficiency in data collection, but which is more manageable than the original factor of 1,000.

Currently, there is f.o.n.a.r. technique (field focused nuclear magnetic resonance) and sensitive point imaging. In these approaches a signal is preferentially obtained from an approximately spherical region within the body. The FONAR approach of Damadian achieves this by applying static gradients or otherwise warping the main magnetic field, such that signal from outside the point of interest is rapidly dephased, and thus does not contribute a signal. This approach is most suitable for gradient echo imaging. The sensitive point approach of Hinshaw involves application of time varying gradients that dephase signal from outside of the point, and allows the point to be positioned within the body with greater ease than the FONAR approach. Again, the sensitive point method is most compatible with gradient echo imaging. Unlike CORE, neither technique relies on establishing a steady-state signal, they did not envisaged using gradients and RF to excite a cylindrical region, neither technique employed a shaped RF pulse slab-selective region that was progressively rotated, and neither of the existing approaches applied imaging gradients at a fixed orientation as the region of interest was moved.

BRIEF SUMMARY OF THE INVENTION

The present invention pertains to a magnetic resonance imager performing images of a patient. The imager comprises imaging coils. The imager comprises receiver coils. The imager comprises a computer that causes the imaging coils to produce a first steady-state free precession excitation slab with respect to a first position regarding a target of the patient during a first repetition time, and a second steady-state free precession excitation slab with respect to a second position different from the first position regarding the target during a second repetition time; and forming a first 3-D dataset of the target associated with the first excitation slab and a second 3-D image dataset of the target associated with the second excitation slab from information received from the receiver coils. The first 3-D image dataset and the second 3-D image dataset, together defining a series of 3-D image datasets for each repetition time; and producing an image of the target from the series of 3-D image datasets.

The present invention pertains to a method for analyzing a patient. The method comprises the steps of imaging a first steady state free precession excitation slab with respect to a first position regarding a target during a first repetition time. There is the step of forming a first 3-D dataset of the target associated with the first excitation slab. There is the step of imaging a second steady-state free precession excitation slab with respect to a second position different from the first position regarding the target during a second repetition time There is the step of forming a second 3-D image dataset of the target associated with the second excitation slab There is the step of providing the first 3-D image dataset and the second 3-D image dataset, together defining a series of 3-D image datasets for each repetition time to a computer There is the step of producing an image of the target by the computer from the series of 3-D image datasets.

The present invention pertains to a method to evaluate coronary arteries to assess their degree of stenosis. The method comprises the steps of obtaining data with an MRI of each of a plurality of steady-state free precession excitations slabs rotated about the arteries. There is the step of producing with an MRI projective angiographic views of the coronary arteries from the data.

The invention describes an approach to prepare the magnetic resonance signal to allow imaging over a limited volume, optionally offset from the surface of the body, with signal intensity suitable to provide tomographic or angiographic visualization of blood vessels and structures. The approach is termed Cylindrical Offset Region of Excitation (CORE). The CORE approach prepares the signal at the excitation stage such that a cylindrical region, optionally offset from the surface of the body, yields a brighter signal than regions closer to the surface of the body. Conventionally, regions closest to the surface of the body, where signal receiver coils are typically located, are the brightest features that characterize most body images. In the CORE signal preparation procedure, a cylindrical region remote from the surface yields the brightest signal. This remote bright region can be utilized in a number of existing approaches to rapidly acquire tomographic or angiographic data. However, to optimally apply many existing sparse sampling strategies, additional post acquisition signal processing is required to prepare the data for efficient scan-time reduction. The essential features of CORE involve the manner of signal excitation and spatial encoding. Further, depending on the data reduction/rendition strategy, application of suitable post acquisition signal processing is required. For illustration purposes, two approaches are described to rapidly image the coronary arteries with high resolution.

The present invention pertains to a computer readable medium storing a computer program which when executed by a computer of a Magnetic Resonance Imager forms an image of a patient. The computer program comprising instructions for the computer generated steps of imaging a first steady state free precession excitation slab with respect to a first position regarding a target during a first repetition time. There is the step of forming a first 3-D dataset of the target associated with the first excitation slab. There is the step of imaging a second steady-state free precession excitation slab with respect to a second position different from the first position regarding the target during a second repetition time There is the step of forming a second 3-D image dataset of the target associated with the second excitation slab There is the step of providing the first 3-D image dataset and the second 3-D image dataset, together defining a series of 3-D image datasets for each repetition time to a computer There is the step of producing an image of the target by the computer from the series of 3-D image datasets.

BRIEF DESCRIPTION OF THE SEVERAL VIEWS OF THE DRAWING

In the accompanying drawings, the preferred embodiment of the invention and preferred methods of practicing the invention are illustrated in which:

FIG. 14a shows the physical object and three representative viewing angles. At each view angle a projective view of the object is acquired. The respective projective views are shown in FIG. 14b. Note the relative positions of the triangular and rectangular features shift relative to each other as the view angle changes.

FIG. 15a shows that the three projective views of FIGS. 14a and 14b are shifted such that the rectangular features which corresponds to a certain depth in the body is aligned in each projection. FIG. 15b shows the results of adding the shifted projective views, whereby the features at the depth of the rectangle are reinforced, and other features, such as the triangle are still present but become spatially dispersed and do not reinforce.

DETAILED DESCRIPTION OF THE INVENTION

Figure 16:
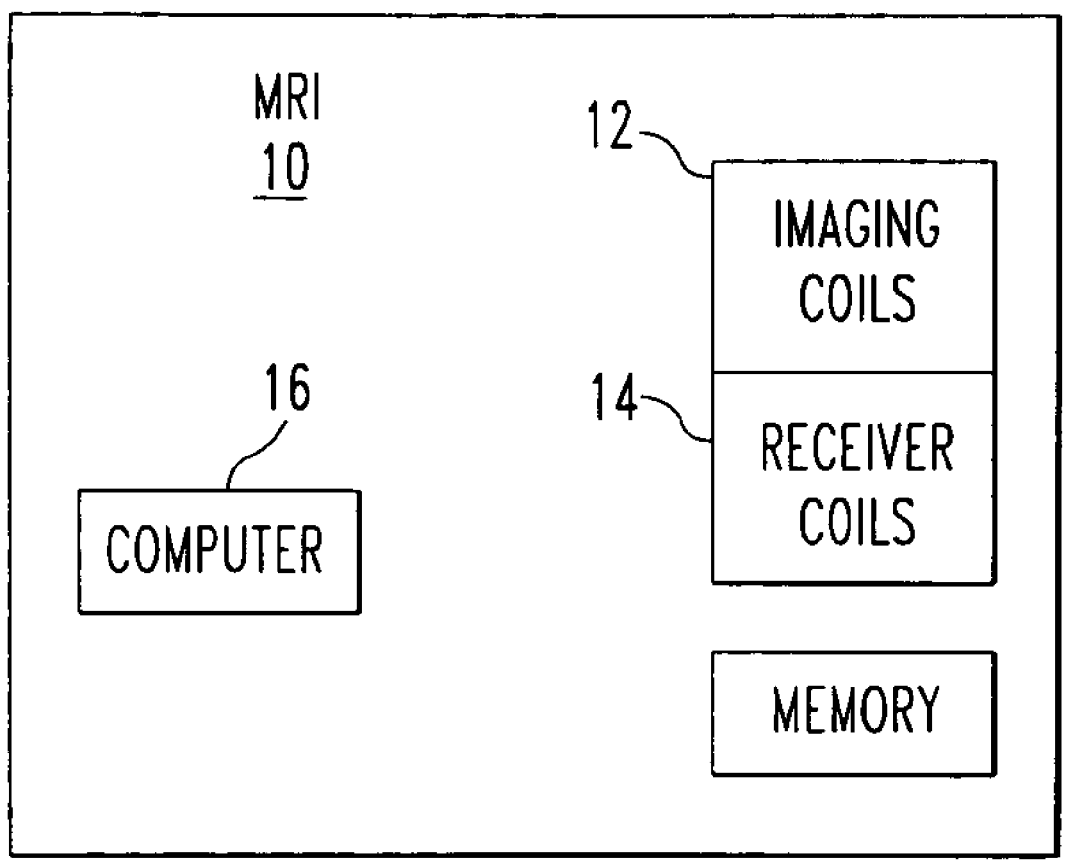
FIG. 16 is a schematic representation of a magnetic resonance imager of the present invention.

Referring now to the drawings wherein like reference numerals refer to similar or identical parts throughout the several views, and more specifically to FIG. 16 thereof, there is shown a magnetic resonance imager 10 performing images of a patient. The imager 10 comprises imaging coils 12. The imager 10 comprises receiver coils 14. The imager 10 comprises a computer 16 that causes the imaging coils 12 to produce a first steady-state free precession excitation slab with respect to a first position regarding a target of the patient during a first repetition time, and a second steady-state free precession excitation slab with respect to a second position different from the first position regarding the target during a second repetition time; and forming a first 3-D dataset of the target associated with the first excitation slab and a second 3-D image dataset of the target associated with the second excitation slab from information received from the receiver coils 14. The first 3-D image dataset and the second 3-D image dataset, together defining a series of 3-D image datasets for each repetition time; and producing an image of the target from the series of 3-D image datasets.

Preferably, the computer 16 causes the imaging coils 12 to produce the second excitation slab rotated about a center of the target relative to the first excitation slab. The computer 16 preferably causes the imaging coils 12 to produce additional excitation slabs rotated about a center of the target, which together with the first and second excitation slabs, defines a series of excitation slabs. Preferably, the computer 16 causes the imaging coils 12 to excite an approximately cylindrical region with a long axis of the cylindrical region disposed along one axis of the body and the circular cross section encompassing the target, and the cylindrical region is common to the series of excitation slabs.

Preferably, the computer 16 causes the imaging coils 12 to excite additional excitation slabs includes the step of arranging the series of slabs to be excited and an angle of rotation separating successive slabs in the series of slabs such that a last slab of the series is one uniform rotation step separated from the first slab. The computer 16 preferably causes the imaging coils 12 to repeat for each cycle of successive cycles an identical pattern of the series of slabs. Preferably, the computer 16 causes the receiver coils 14 to acquire during each cycle at least one line of k-space data for each time point within the cycle.

The computer 16 preferably causes the imaging coils 12 to maintain encoding gradients at a constant axes while the slabs are rotating. Preferably, the computer 16 causes the imaging coils 12 to progress periodically to a phase encoding axes to better align with the slab at a given time. The computer 16 preferably rotates the k-space data to achieve registration between successive slabs. Preferably, the computer 16 maps each k-space data set onto a uniform grid by taking a smallest sampling interval in k-space as a uniform grid size.

The present invention pertains to a method for analyzing a patient. The method comprises the steps of imaging a first steady state free precession excitation slab with respect to a first position regarding a target during a first repetition time. There is the step of forming a first 3-D dataset of the target associated with the first excitation slab. There is the step of imaging a second steady-state free precession excitation slab with respect to a second position different from the first position regarding the target during a second repetition time. There is the step of forming a second 3-D image dataset of the target associated with the second excitation slab There is the step of providing the first 3-D image dataset and the second 3-D image dataset, together defining a series of 3-D image datasets for each repetition time to a computer 16 There is the step of producing an image of the target by the computer 16 from the series of 3-D image datasets.

Preferably, there is the step of imaging the second excitation slab includes the step of imaging the second excitation slab rotated about a center of the target relative to the first excitation slab. There is preferably the step of imaging additional excitation slabs rotated about a center of the target, which together with the first and second excitation slabs, defines a series of excitation slabs.

Preferably, there is the step of exciting an approximately cylindrical region with a long axis of the cylindrical region disposed along one axis of the body and the circular cross section encompassing the target, and the cylindrical region is common to the series of excitation slabs.

The step of exciting additional excitation slabs preferably includes the step of arranging the series of slabs to be excited and an angle of rotation separating successive slabs in the series of slabs such that a last slab of the series is one uniform rotation step separated from the first slab. Preferably, there is the step of repeating for each cycle of successive cycles an identical pattern of the series of slabs. There is preferably the step of acquiring during each cycle at least one line of k-space data for each time point within the cycle.

Preferably, there is the step of maintaining encoding gradients at a constant axes while the slabs are rotating. There is preferably the step of progressing periodically a phase encoding axes to better align with the slab at a given time. Preferably, there is the step of rotating the k-space data to achieve registration between successive slabs. There is preferably the step of mapping each k-space data set onto a uniform grid by taking a smallest sampling interval in k-space as a uniform grid size.

The present invention pertains to a method to evaluate coronary arteries to assess their degree of stenosis. The method comprises the steps of obtaining data with an MRI of each of a plurality of steady-state free precession excitations slabs rotated about the arteries. There is the step of producing with an MRI projective angiographic views of the coronary arteries from the data.

The present invention pertains to a computer readable medium storing a computer program which when executed by a computer of a Magnetic Resonance Imager forms an image of a patient. The computer program comprising instructions for the computer generated steps of imaging a first steady state free precession excitation slab with respect to a first position regarding a target during a first repetition time. There is the step of forming a first 3-D dataset of the target associated with the first excitation slab. There is the step of imaging a second steady-state free precession excitation slab with respect to a second position different from the first position regarding the target during a second repetition time There is the step of forming a second 3-D image dataset of the target associated with the second excitation slab There is the step of providing the first 3-D image dataset and the second 3-D image dataset, together defining a series of 3-D image datasets for each repetition time to a computer There is the step of producing an image of the target by the computer from the series of 3-D image datasets.

In the operation of the invention, the following is a description of CORE as applied to image the coronary arteries.

Excitation

Figure 1:
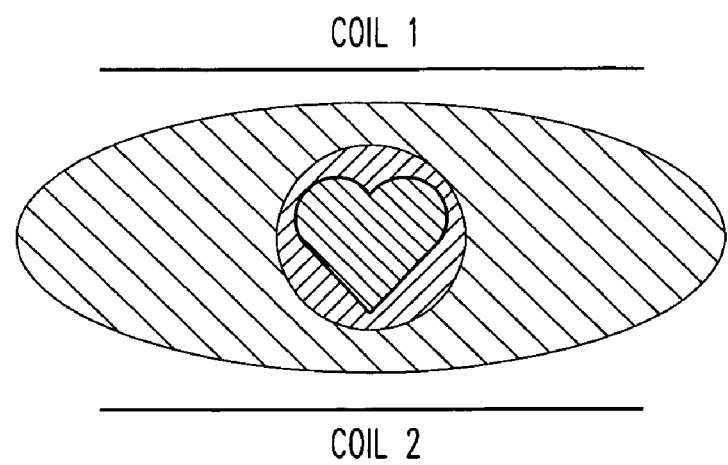
FIG. 1 is a schematic of the CORE signal preparation scheme.

The excitation aspect of CORE is applied to excite an approximately cylindrical region within the body (FIG. 1). FIG. 1 is a schematic of the CORE signal preparation scheme. The ellipse represents a cross-section through the thorax, with the position of the heart indicated. Coil 1 and Coil 2 are representative receiver coils 14 for the MRI signal. The shaded circle (surrounding the heart) represents the region of brightest signal produced by the CORE preparation scheme. Over the extended body region, the bright signal region is cylindrical in shape, with the length of the cylinder directed from head to foot in this example.

Figure 2:
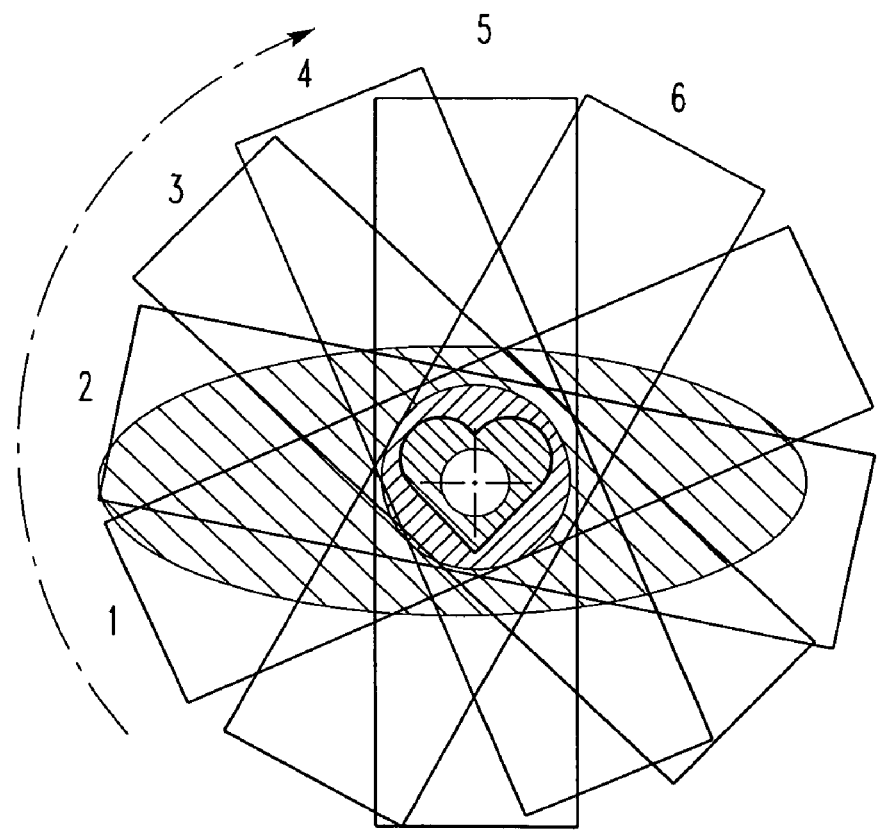
FIG. 2 is a schematic of the manner in which multiple excitation slabs are progressively applied in the CORE signal preparation scheme.

In CORE an approximately cylindrical region is excited, with the long axis of the cylinder typically aligned along the long axis of the body and the circular cross-section encompassing the region of interest, such as the heart in this example. The cylindrical region is common to a series of excitation slabs, and each slab is imaged to provide a series of 3D image data sets. The manner in which the cylindrical region is arranged to yield a higher signal than surrounding tissue is illustrated in FIG. 2. FIG. 2 is a schematic of the manner in which multiple excitation slabs are progressively applied in the CORE signal preparation scheme. A series of signal excitation slabs (6 in this example) are applied in a manner such that they progressively rotate around a fixed rotation point (cross-hairs target over "heart" region). Here progressively excited slabs 1-6 are indicated, with the curved arrow indicating the direction of progression. In CORE, the excitation slabs are applied to prescribe a complete circle (i.e. the last slab in the series being close in position to slab 1). The rotating slab pattern is repeated until sufficient imaging data are acquired for each slab position.

Figure 3:
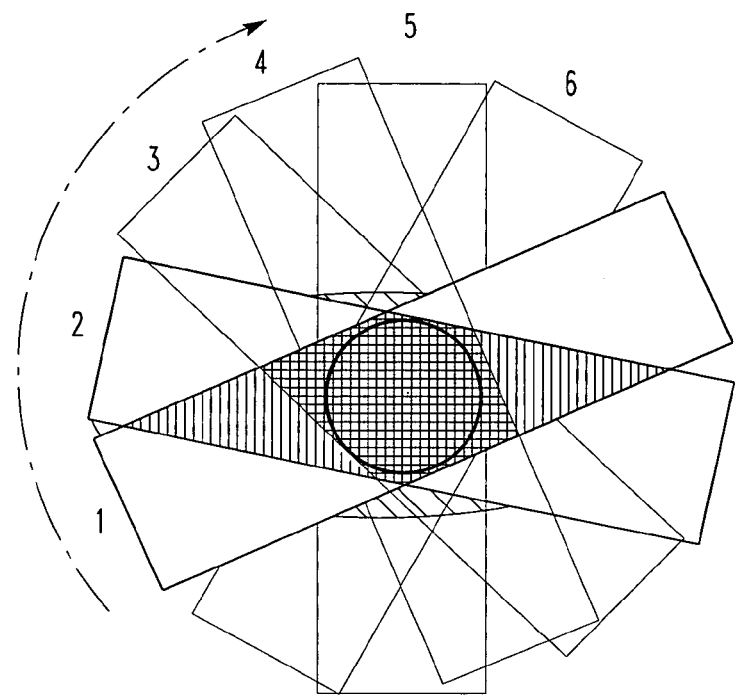
FIG. 3 shows the Manner of overlap between successively applied slabs is illustrated.

In CORE, a steady-state-free-precession (SSFP) excitation scheme is applied using a rotating series of slabs. To establish and maintain the SSFP signal, the body region must experience a uniform train of excitation pulses at regular repetition time (TR) intervals, and during each interval the product of application time and amplitude of any gradients applied must balance to zero. In CORE, the train of excitation pulses is applied as a series of slabs, with each successive slab rotated bout a center, and centered within the body region of interest, in this case within the heart. The combination of the number of slabs to be excited and angle of rotation separating successive slabs is arranged such that the last slab of the series is one uniform rotation step separated from the first slab, such that during the successive cardiac cycles the identical pattern of slabs is repeated for each cycle. In this manner, successive slabs (e.g. between slab 1 and 2) typically will overlap to a high degree (FIG. 3), but as further slabs in the series are excited, the overlap between temporally distant slabs (e.g. between slab 1 and 3) becomes progressively less in area. In FIG. 3 shows Manner of overlap between successively applied slabs is illustrated. The region of overlap between slabs 1 and 2 is indicated by the striped shading. The overlap between slabs 1 and 3 is indicated by the checkered shading. The central circle indicates the approximate net overlap between similarly applied multiple slabs. In this manner the central circle (extends to a cylinder in 3D) is the only region that experiences an excitation pulse from the successively applied slabs.

In this progressive manner, the region common to all slabs is an approximately a cylinder centered around the center of rotation, with a diameter approximating to the width of a representative slab. In this way, the cylindrical region attains a high SSFP signal due to reinforcement of the excitation process in this region, while outer regions attain a lower, non-steady state signal, due to the progressive disruption of the excitation pattern in these outer regions. Thus, the result of this excitation process is to generate a cylinder centered on the heart that yields a bright signal, while other body regions outside of the cylinder yield a proportionately lower signal.

Encoding

Figure 4:
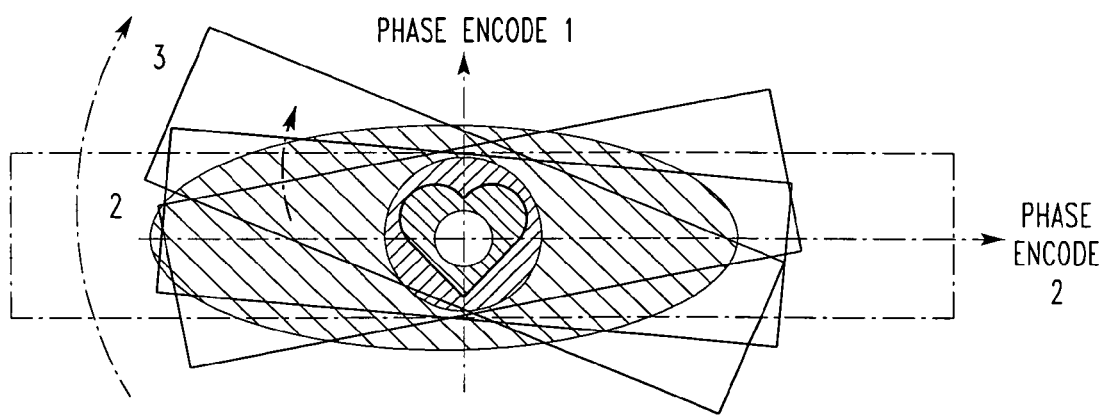
FIG. 4 is a schematic of encoding information over a series of slabs.

As indicated above, a series of slabs are excited, with each slab excited at a separate angle to the body. The common cylindrical region yields a preferentially high signal due to sustaining steady state free precession conditions, while the outer regions of each slab yield a lower signal. When encoding spatial information in a series of 3D slabs, or even for one slab position in a time resolved manner it is typically necessary to encode spatial information into each slab over an extended number of excitation pulses. That is, during each cardiac cycle, more than one line of k-space data are acquired for each time point within the cycle. In conventional imaging where the same physical region is excited each time and the images are time resolved throughout the cardiac cycle, encoding typically is conducted over an extended time of 50-100 ms, which may encompass 15-30 slab excitations. However, in the CORE excitation scheme, successive slabs are rotated relative to each other, with the only common region between slabs being the cylinder of bright signal. Thus, the encoding scheme of CORE must accommodate the different orientation of a series of successively excited slabs. In conventional imaging, typically the spatial encoding gradients are aligned with the major axes of the excitation slab. In CORE, the excitation and encoding schemes are separated, such that for a series of successive slabs (e.g. 30 successive slab excitations), the encoding gradients are maintained at a constant axes instead of rotating with the slabs (FIG. 4). FIG. 4 is a schematic of encoding information over a series of slabs. In this example 3 representative slab excitations are shown in black. For each slab position, image data are encoded in the two directions shown: phase encode 1 and phase encode 2. Encoding information in this way can be regarded as encoding a fixed slab, shown in red. The common cylindrical region (circular cross-section is seen encompassing the heart) is correctly encoded by this scheme. However, the outer regions of each slab effectively move relative to the fixed phase encoding gradients, and do not contribute in a coherent manner, since these regions are effectively moving relative to the fixed encoding axes with some regions even move out of the field of view. The smaller curved arrow shows that the relative motion of a representative pixel.

Figure 5:
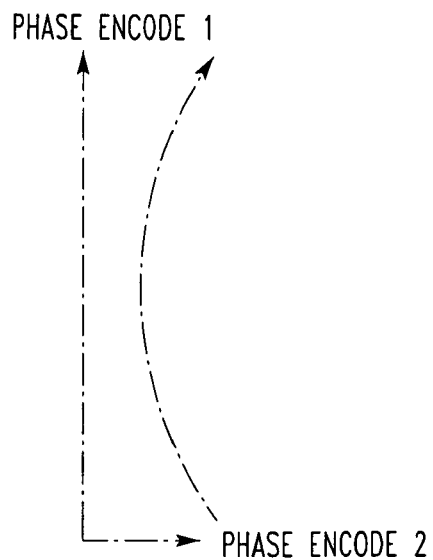
FIG. 5 is a schematic of motion of pixels not within the common cylindrical region relative to the phase encoding 1 and 2 axes of FIG. 4.

In this scheme, regions outside of the cylindrical region effectively move relative to the two fixed phase encoding axes. However, for typical body and slab dimensions relative motion along one of the phase encoding axes dominates, and this relative motion increases in relevance with distance from the center of rotation. Thus, in the phase encoding scheme, a motion related artifact is expected to manifest preferentially along one phase encoding axis (FIG. 5). FIG. 5 is a schematic of motion of pixels not within the common cylindrical region relative to the phase encoding 1 and 2 axes of FIG. 4. Apparent motion relative to the phase encoding axis 1 is typically much larger than motion relative to phase encoding axis 2. In this case, while spatial information is encoded along both axes by the phase encoding strategy, motion artifact is expected to dominate in the direction of Phase encoding 1 axis. This motion artifact, which is expected to result in increased noise along the phase encoding 1 axis, is expected to increase in importance towards the outer edges of the slab. Thus towards the center of rotation, centered on the cylindrical target region, artifact from this source is expected to be minimal.

Figure 6:
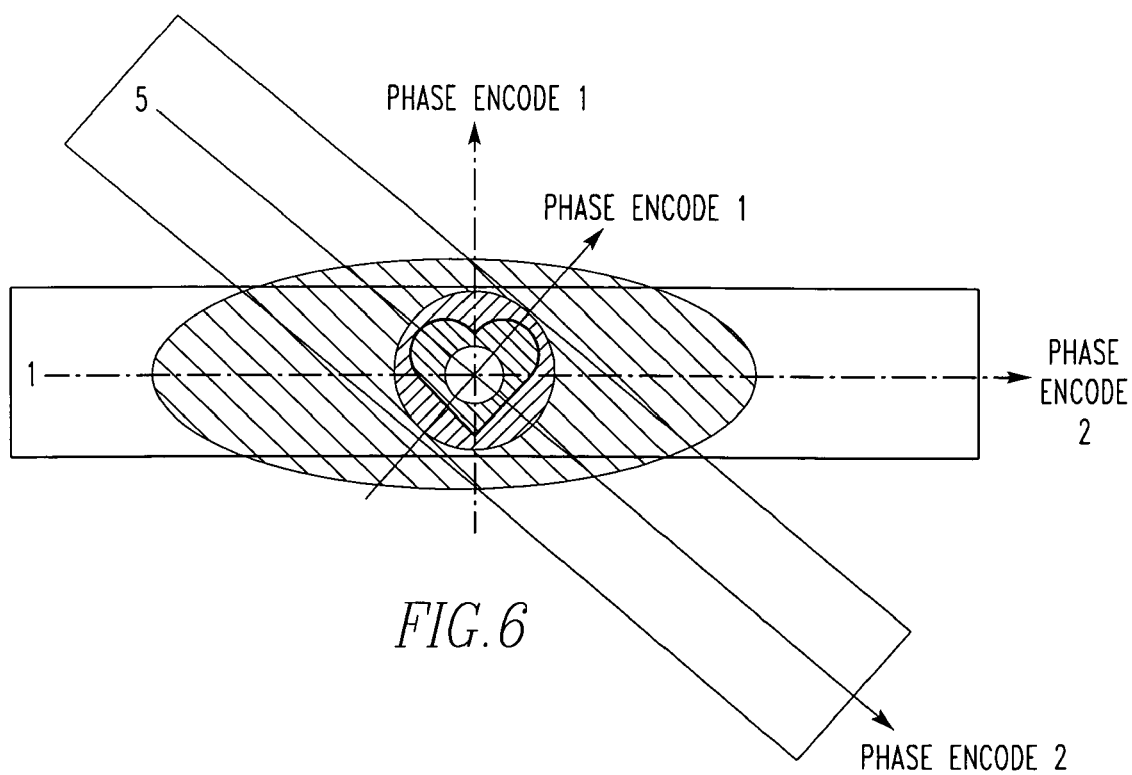
FIG. 6 is a schematic of how the Phase encoding 1 and Phase encoding 2 axes are progressively updated as the slabs progress in rotation angle.

Since this artifact is lowest at the center of rotation, it should not significantly overlap with the cylindrical target region. As the slabs continue to rotate, the two phase encoding axes are periodically progressed to better align with the local slab conditions (FIG. 6). FIG. 6 is a schematic of how the Phase encoding 1 and Phase encoding 2 axes are progressively updated as the slabs progress in rotation angle. Two representative slabs are shown: 1 and 5, and for these two slab positions, the two phase encoding axes are rotated to align with the slab positions.

For instance, if the phase encoding axes are fixed for 30 successive slab excitations and 300 slab excitations are used to span a full circle, then there will be 10 distinct sets of phase encoding axes. Thus, while 300 slabs are excited, image information will only be represented at 10 distinct slab locations.

Post Acquisition

Figure 7:
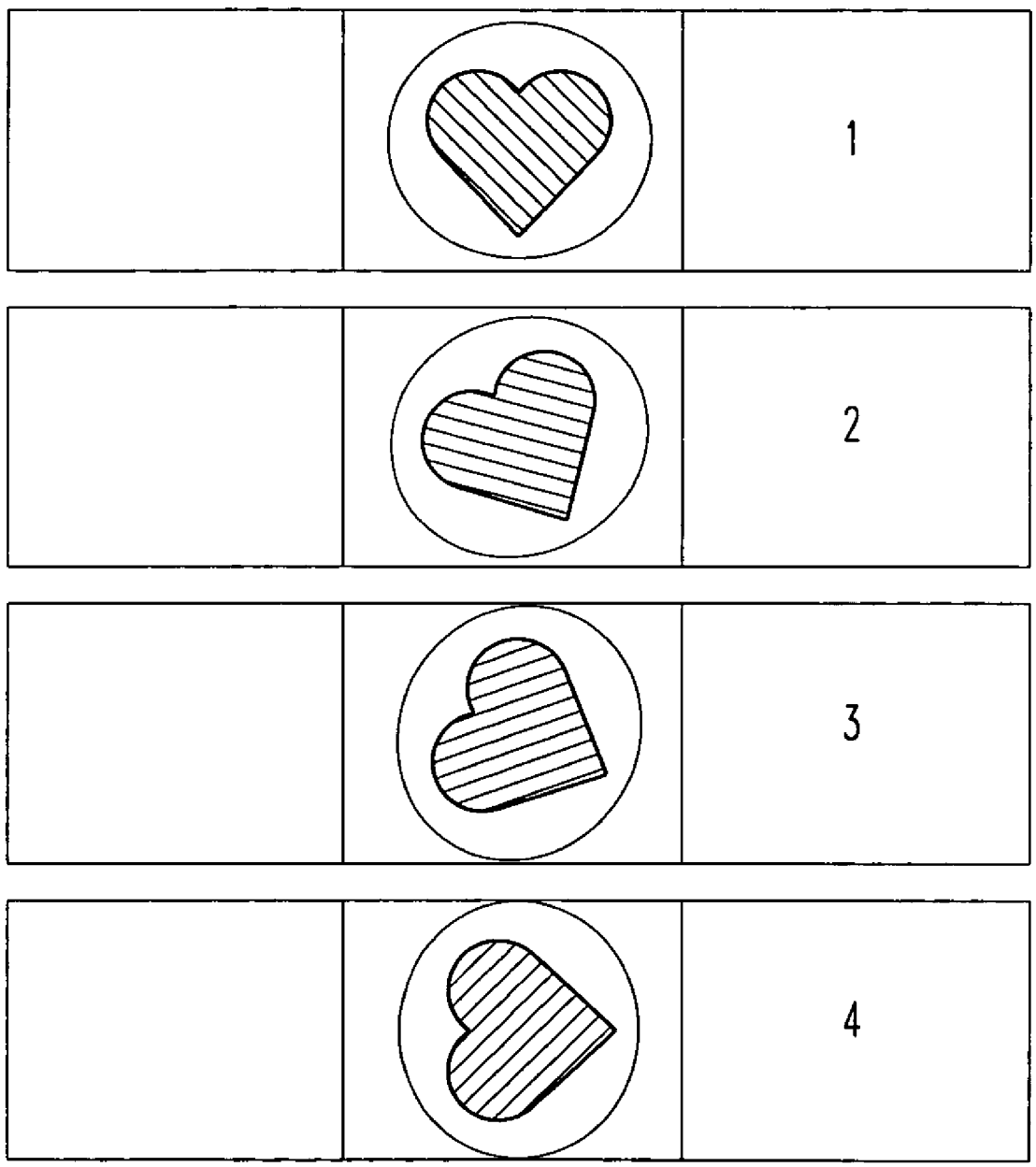
FIG. 7 is a schematic of the orientation of common image features between successive slabs (1-4 in this example) in the CORE excitation scheme. In this case, the "heart" appears to be progressively rotated between slabs when the slabs are viewed in the same orientation as each other.

The excitation and encoding schemes are integral to the CORE technology. However, it is possible to additionally process the CORE data so as to allow dramatic efficiencies in data acquisition. These approaches are not necessary for CORE, but are described here to illustrate the manner in which CORE can allow additional efficiencies in data collection to reduce scan time. The manner in which data are acquired using the dominant cylindrical excitation pattern can be adapted to many uses. However, further efficiencies in processing CORE data are achievable by the additional step of rotating the k-space data to achieve registration between successive slabs. In successively imaged slabs, the dominant cylindrical region is common to each slab and appears to be progressively rotated when considering the slabs in progressive order (FIG. 7). FIG. 7 is a schematic of the orientation of common image features between successive slabs (1-4 in this example) in the CORE excitation scheme. In this case, the "heart" appears to be progressively rotated between slabs when the slabs are viewed in the same orientation as each other.

Figure 8A:
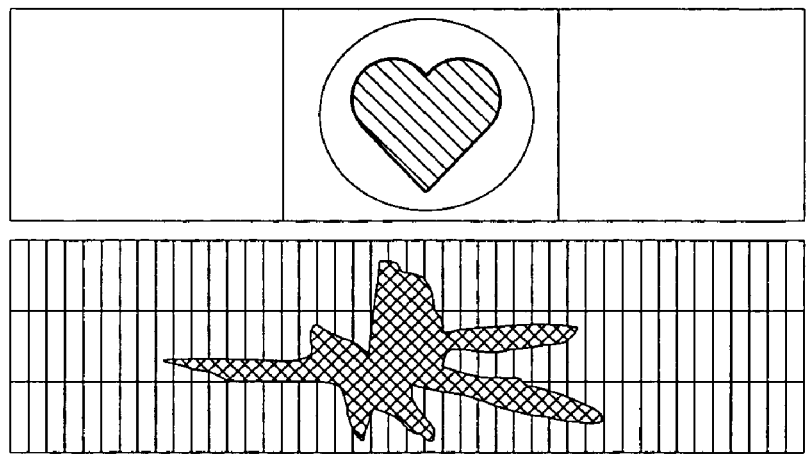
FIGS. 8a and 8b are schematics of the imaged object ("heart) and corresponding k-space representation for two slabs that are perpendicular to each other.
Figure 8B:
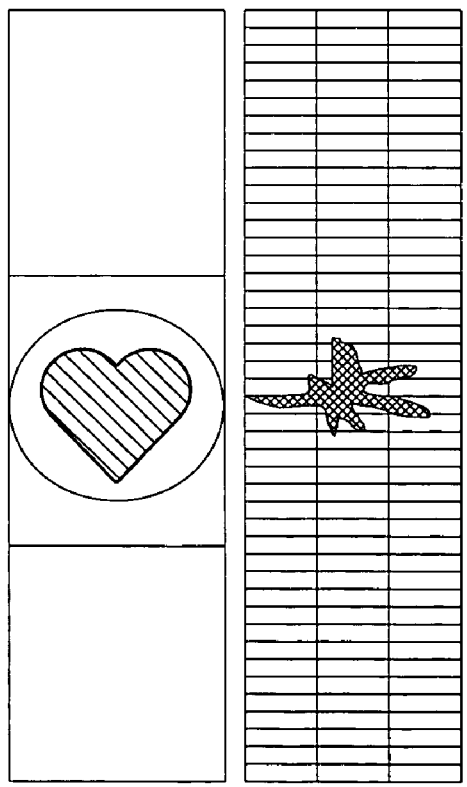

The k-space signal has the property that rotation of the imaged object is equivalent to the same rotation of the k-space signal. When considering the dominant cylindrical signal in successive slabs, the imaged object appears as if it were progressively rotated, which corresponds to a similar progressive rotation of the k-space signal between successive slabs. Consider two such slabs, in which the cylindrical region containing the heart is imaged in a horizontal manner in the first slab and in a vertical manner in the second slab. In this case, the two slabs are rotated by 90 degrees relative to each other (FIGS. 8a and 8b). FIGS. 8a and 8b are schematics of the imaged object ("heart) and corresponding k-space representation for two slabs that are perpendicular to each other. FIG. 8a shows the heart imaged in a slab oriented horizontally, with the corresponding k-space representation below it. FIG. 8b shows the heart imaged in a slab oriented vertically, with the corresponding k-space pattern on the right. In these instances, k-space is sampled in an asymmetric manner (represented by the asymmetric grid, which is finely graduated in the long direction of the slab cross-section and coarsely graduated in the short direction of the slab cross-section). Note the similar orientation of the k-space pattern between the two slabs, indicating the rotational relationship between the imaged object and the k-space representation (i.e. effectively rotating the object, is represented in k-space by a similar rotation).

Figure 9:
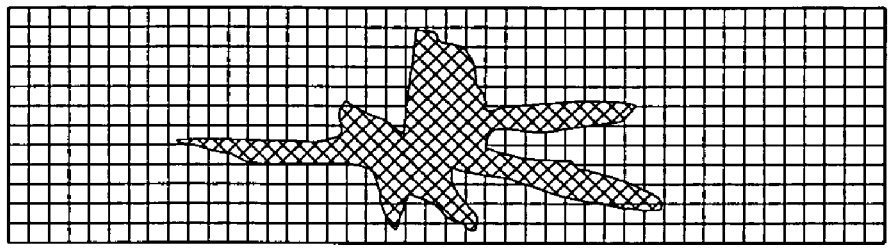
FIG. 9 is a schematic of the re-gridded k-space data of two slabs (angulated at 90 degrees in this example).
Figure 9:
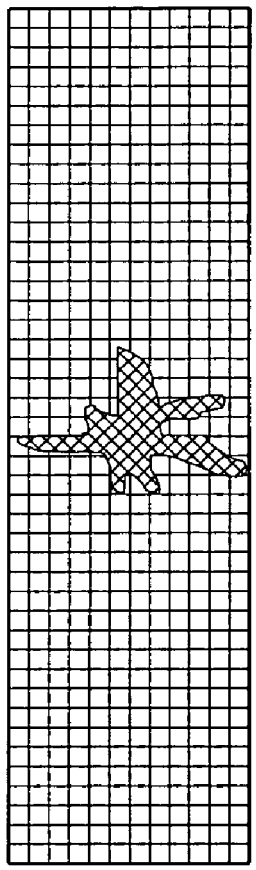
Figure 9:
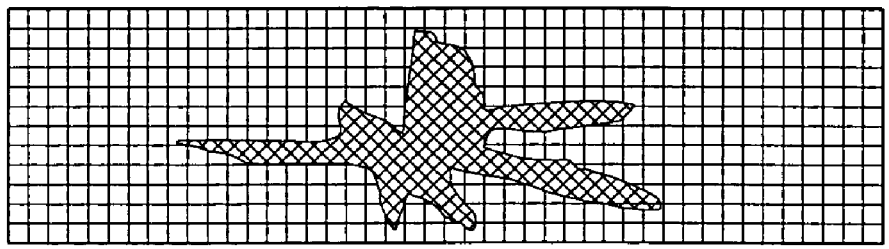

Under conditions that the same physical region is imaged in the two slabs, applying a 90 degree rotation to the k-space representation of one data set will convert it into the k-space present in the orthogonal data set. Under conditions that the resolution along the two axes of the slab are identical, this rotation operation will exactly map one k-space data set onto the other. Here we consider the more typical case where the resolution along each of the two axes of k-space are different, e.g. along the short direction of the slab a coarse sampling density is used, while along the long direction of each slab a fine sampling density is used. Thus, in this case, rotating one k-space data set to match the other in orientation is possible, but resolution cannot be matched. To allow the rotation to be performed in the general case, each of the k-space data sets are mapped onto a uniform grid, taking the smallest sampling interval in k-space as the uniform grid size (FIG. 9). FIG. 9 is a schematic of the re-gridded k-space data of two slabs (angulated at 90 degrees in this example). Here the finer grid information is represented along each axis of each slab. By equalizing the resolution along the two axes, allows the rotated data to map between corresponding pixels in a straightforward manner. Thus, the rotated data of the "vertical" slab will correspond directly to the directly acquired "horizontal" slab.

Figure 10:
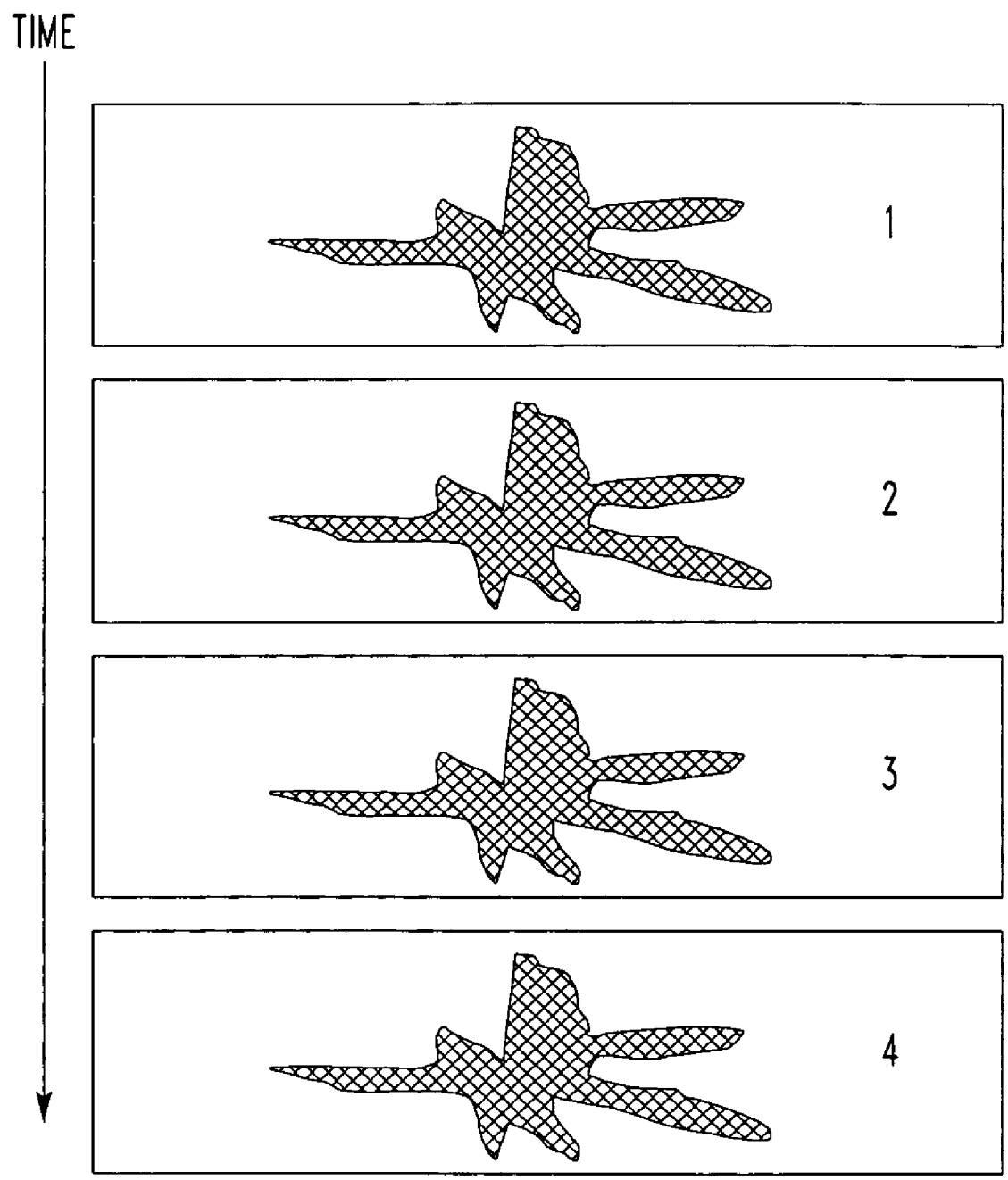
FIG. 10 is a schematic of the re-gridded and rotated k-space data of successive slabs (1-4 in this example) with the time axis indicated by the vertical arrow.

By re-gridding and rotating the k-space data sets, the data are arranged to match in similarly oriented slabs. In a time resolved series of slabs (in the case of coronary artery imaging, the time resolved dimension spans the cardiac cycle) the k-space data can be arranged to change only gradually between slabs by arranging for two conditions to be simultaneously met: 1) the degree of overlap between slabs is kept relatively high (i.e. low rotation angle step, e.g. 16 degrees); and 2) the time interval between slabs is set relatively low (e.g. $1/30^{th}$ of cardiac cycle). Thus, in a suitably acquired data set, the change in k-space between successive slabs is relatively gradual despite the advancement in time and change in orientation of the slab relative to the imaged body region (FIG. 10). FIG. 10 is a schematic of the re-gridded and rotated k-space data of successive slabs (1-4 in this example) with the time axis indicated by the vertical arrow. Re-gridding is performed to achieve equality of k-space resolution between orientations, such that a finely resolved direction of k-space in one slab can be mapped to a coarsely resolved direction of k-space in another slab. Rotation of the imaged object corresponds to rotation of the k-space data. Thus, in this case, the component of the k-space data corresponding to the dominant bright region will align between slabs. The k-space signal corresponding to the outer slab regions are distorted by this procedure.

By arranging for the time series of slab data sets to exhibit a high degree of continuity in k-space data, it is feasible to apply sparse sampling strategies that are applicable for data resolved over the k-space and time dimensions (the so called KT space). Several KT space approaches are applicable to reduce the scan time, in addition to certain parallel imaging strategies and strategies specific to 3D data sets. These strategies directly affect the acquisition of data, but as indicated above, their success is dependent on the post processing data registration steps performed as a part of CORE.

Rapid Acquisition

For illustrative purposes here considered the MACH KT (U.S. patent application Ser. No. 11/786,685, incorporated by reference herein) sparse sampling approach and the SCIPI (U.S. patent application Ser. No. 11/715,755, incorporated by reference herein) parallel imaging approach. The MACH sparse sampling scheme is applied to sparsely sample the time resolved k-space data at the acquisition stage. The details of this are not integral to the description of the CORE technology, but in brief a sparse pattern of which k-space lines are to be acquired at each time point. In MACH, the degree of sparse sampling over the k-space and temporal domains can be set to suite the conditions of the data set. For example, in the case of highly correlated time resolved data, the data can be sampled in a highly sparse manner, while data with only a moderate degree of correlation between data sets requires a denser sampling pattern. Irrespective of the degree of sparseness allowed, the general principle is that unsampled k-space data points are filled in by a predictive algorithm based on the sampled points. The CORE signal preparation provides successive k-space data sets with favorable properties that allow sparse KT space acceleration approaches to proceed with high efficiency: 1) for a given slab orientation the acquired k-space resolution may change between successive slabs, but by mapping the data to a uniform matrix and performing the rotation, a one-to-one relationship is established between corresponding pixels in the series of slabs, and 2) by arranging for the angle between successive slabs to be low, the spatial-temporal continuity can be high over several successive slabs. It is anticipated that the MACH approach can accelerate the scan by up to a factor of 8.

Figure 11:
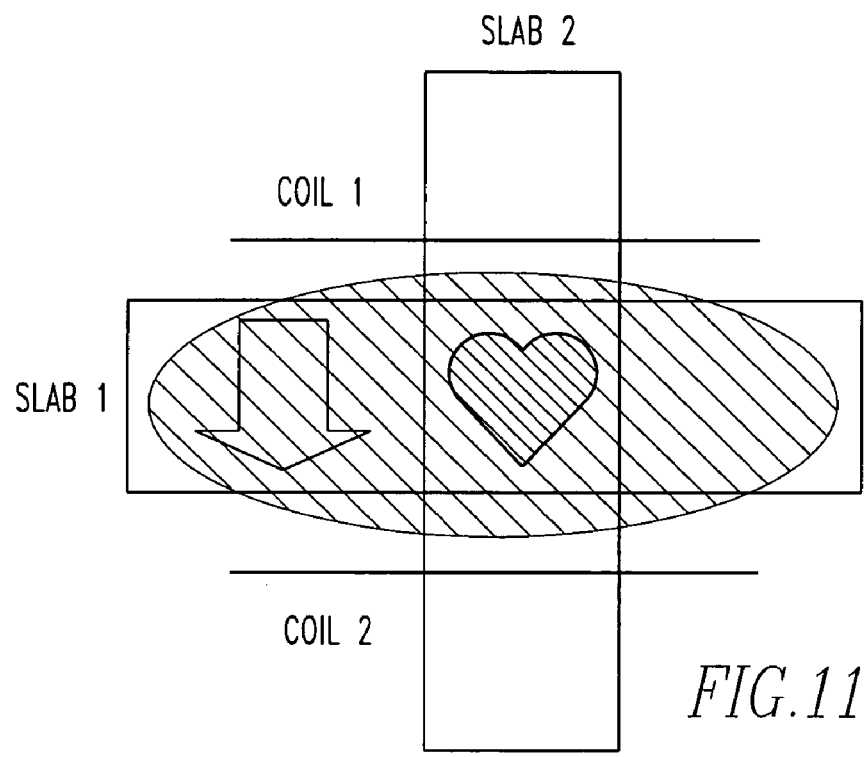
FIG. 11 shows that, without CORE, the signal response gradient axis is dominated by the relative position of the receiver coils and the body.

The properties of CORE acquisition and processing that make the series of successive slabs suitable for parallel-type scan reduction strategies are considered here in context of the SCIPI approach. For parallel imaging to be successful, there has to be a signal gradient response present for one or more images generated from one or more receiver channel coil elements, and this signal gradient has to predominantly coincide with a phase encoding direction. Under these conditions, reduced sampling along that phase encoding direction can be achieved at the acquisition stage, and the image can be fully represented without signal fold over by applying suitable post signal processing. Without CORE, slabs acquired at a series of angles to the body cannot in general apply the parallel imaging data sampling approach in a uniform manner. Consider the two slabs in FIG. 11, in one orientation, parallel imaging is optimally applied along the short phase encoding axis, and in the second slab, phase encoding is optimally applied along the long phase encoding axis. FIG. 11 shows that, without CORE, the signal response gradient axis is dominated by the relative position of the receiver coils 14 and the body. Consider that coil 1 and coil 2 in this example demonstrate a vertical signal gradient between coil 1 and coil 2 (big arrow). For slab 1, which is predominantly positioned parallel to coils 1 and 2 this means that parallel imaging favors reduction along the short axis of the slab (big arrow). While for slab 2, the signal gradient direction is still vertical, which indicates that the parallel imaging direction in this case is along the long axis of the slab.

Figure 12:
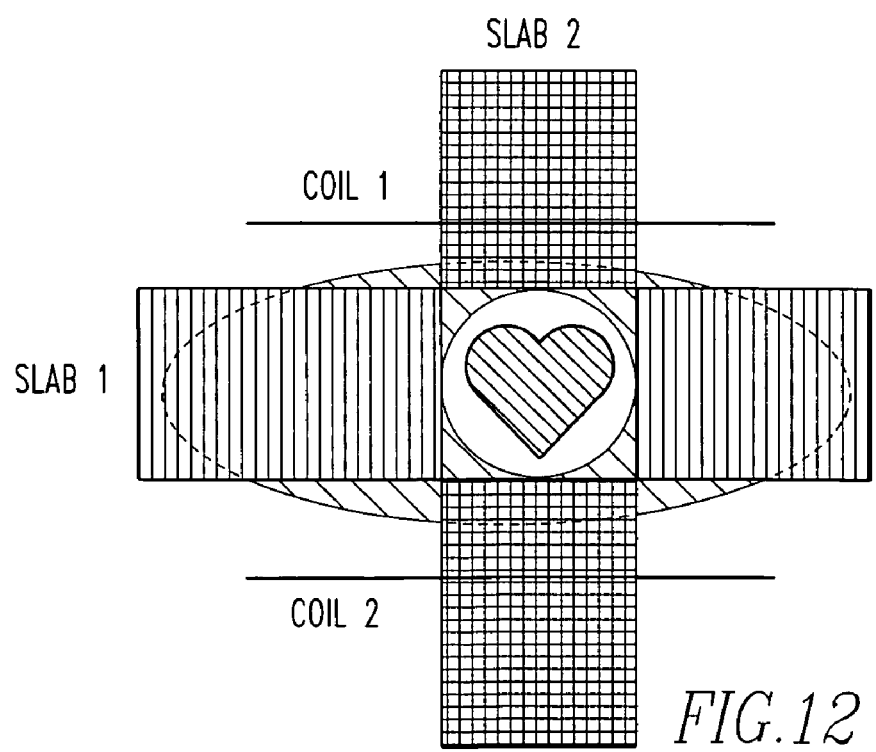
FIG. 12 shows that, with CORE, the signal response gradient axis is dominated by the bright centrally located region (over the heart in this case).

Thus, since parallel imaging has to be applied at the acquisition stage, the sampling strategy would have to be modified from slab to slab in a manner dependant on several variables, including relative position of the region of interest and the receiver coil elements. This has the disadvantage, not only of increased complexity of scanning, but that there would typically exist substantial differences in the amount of sampled data between slabs, forcing redundancy for some slab data sets. However, with CORE, since an approximately cylindrical region of preferentially high signal is excited independent of slab orientation or of placement of receiver coil elements, a signal intensity gradient can exist along a common slab direction, e.g. along the long phase encoding direction of the slabs shown in FIG. 12. FIG. 12 shows that, with CORE, the signal response gradient axis is dominated by the bright centrally located region (over the heart in this case). Unlike conventional parallel approaches, the outer regions of each slab (stripped for Slab 1, and checkered for Slab 2) are of lower signal compared to the central region, independent of the slab orientation. In this case any parallel imaging approach could be modified to unfold image data from the two outer edges from the central region, independent of the slab orientation relative to the receiver coils 14. Thus, with CORE, a uniform treatment of parallel imaging can be applied to each slab, and this can always be arranged to be along the long phase encoding direction of the slab.

Thus, with CORE a uniform parallel imaging strategy can be applied to each slab, and importantly, the amount of data to be acquired for each slab is identical. Further, conventional parallel imaging strategies are typically applied to preferentially image a region close to each receiver coil element, which typically is applied to reduce the field of view sampling requirement by a factor of 2 along the phase encoding direction. However, with CORE signal preparation, for the cylindrical region being approximately central to the body (as is the case for coronary artery imaging) then the two outer regions are of lesser signal intensity, and the SCIPI parallel imaging approach can be easily adapted to preferentially represent the central cylindrical region, while removing fold over signal from two outer edges. Thus, in this case, a scan reduction factor of 3 (instead of the more usual 2) can be applied to one phase encoding direction using SCIPI in conjunction with CORE signal preparation.

Another scan time reduction strategy that benefits from the CORE signal preparation stage is data guided signal acquisition to reduce the number of phase encoding acquisitions in each 3D data set. Here the 3D MASK approach is considered. See U.S. patent application Ser. No. 10/701,713, incorporated by reference herein. In brief, in 3D MASK a rapid prescan is acquired which provides a mask of what data to acquire for each 3D slab. The acquisition mask is based on a percentage of signal to be targeted, such that the most significant signal regions are targeted for acquisition, while the least significant data regions are not acquired. The scan percentage can be pre-determined, and the data acquisition mask adjusted to ensure that the amount of data acquired for each slab is identical. Without CORE, the most significant signal would be dominated by body regions closest to the receiver coil elements, which typically represents the outer body regions, with the coronary artery signal being relatively weakly detected. However, with CORE, the signal is dominated by the heart and coronary artery region. Thus, without CORE, a higher percentage of signal would have to be targeted to ensure that the coronary arteries were suitably represented in each data set. In this way, CORE allows 3D MASK imaging to be applied with higher efficiency than if it were not employed.

Data Representation

Figure 13A:
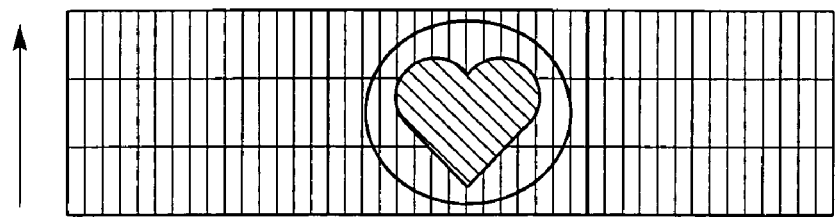
FIGS. 13a and 13b are schematics of the manner of extracting projective views of the coronary arteries from CORE slabs.
Figure 13A:
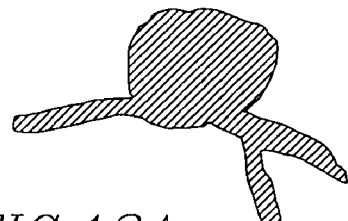
Figure 13B:
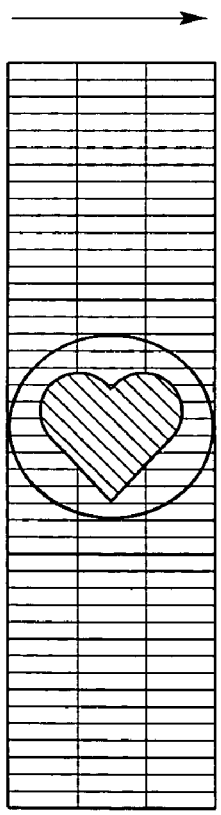
Figure 13B:
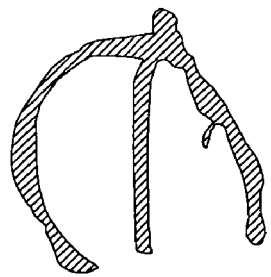

Extraction of image data to view the coronary arteries can be carried out in a number of ways. Here, generating projective views of the coronary arteries is described. In each imaged slab, the in-plane dimensions are imaged at high resolution (e.g. $0.1\times0.1$ mm$^2$ per voxel), while the shorter slab thickness is imaged at relatively poor resolution, e.g. 1 cm per voxel. The poorly resolved dimension is sufficient to obtain separate signal from the coronary artery structures and surrounding bright structures, such as the cardiac chamber blood pool signals. Along the poorly resolved dimension signal processing is applied to remove bright structures that compete with the coronary artery structures. When this process is completed, the remaining signal (including the coronary arteries) will be projected onto the well-resolved plane (FIGS. 13a and 13b). FIGS. 13a and 13b are schematics of the manner of extracting projective views of the coronary arteries from CORE slabs. Using the imaged data, the bright cardiac chamber blood pool signal is removed by performing image processing (manual or automatic signal removal). Additionally, bright signal outside of the cardiac structure can be removed using similar signal processing. Having removed extra-coronary bright signals, the coronary artery data is suitable for viewing in a projective manner. However, each slab orientation is typically suited to viewing the projected coronary artery signals in only one direction. FIG. 13a indicates a view of the heart with the coarsely sampled direction oriented "vertically" (arrow). In this case, viewing the projected coronary structure (shown below the slab) in a vertical manner allows good resolution to be achieved in the horizontal plane. In FIG. 13b, the coronary artery structure is best viewed with the projection formed to view to coronary arteries in a vertical manner (i.e. a horizontal projection). Similarly each slab typically allows a different projective view angle for the coronary arteries, allowing 360 degrees of visualization.

The projection could use the well know maximum intensity projection (MIP) strategy used to view vascular features in MRI. By removing competing signal from each slab, and forming a projection from each image slab, a series of projections of the coronary arteries will be generated. The progressive series of projections presents the coronary arteries (or a selected bed or branch of the coronary artery structures) at progressively advancing angles and at progressive time points through the cardiac cycle.

Signal to Noise

In a typical 3D slab acquisition, the signal to noise (SNR) ratio is determined by the number of data points acquired for each slab, the voxel volume, and the signal reception efficiency of each receiver coil. In the CORE signal preparation, each slab has a known relationship to all the other slabs, which effectively connects them. Thus, in CORE, the SNR is potentially related to the total data for the series of slabs, as opposed to an individual slab. This potentially serves to augment the SNR of the CORE data compared to a conventionally acquired isolated slab. The amount of signal augmentation is dependant on many factors. Here the amount of signal augmentation will be set at 2 for illustrative purposes, but could be higher or lower. For slabs acquired under similar conditions and scan times, the SNR is governed by the voxel volume. Consider a conventional scan where the voxel dimensions are $1\times1\times2$ mm$^3$, representing the current status of coronary artery imaging by MRI. By using CORE, the in plane dimensions are reduced to $0.125\times0.125$, but the slice dimension is increased to 10 mm. The conventional slab volume is 2 mm$^3$, and the CORE voxel volume is 0.156 mm$^3$, representing a reduction factor of approximately 13. A reduction factor of 13 in voxel volume corresponds to a reduction in SNR by a factor of square root of 13, i.e. 3.6. Consider that the SNR of the conventional scan may be 20:1, and reducing this by a factor of approximately 4 reduces it to 5:1, and if the extended CORE acquisition and processing boosted the SNR by a factor of 2 (see above), then the net SNR would be 10:1. Thus, using typical values, it can be seen that despite the dramatic improvement in in-plane resolution, the expected SNR of projective views of the coronary arteries could be in a very usable range, without speculating any improvement in MRI scanner performance.

Resolution

While the CORE signal preparation approach can be used to efficiently target the heart and coronary arteries, attaining the high-resolution signal read out in the in-plane directions may require additional considerations. Above it was demonstrated that an in-plane resolution of 0.125×0.125 mm² can yield an acceptable SNR when using a projective approach. However, conventional SSFP imaging applied on whole body MRI systems typically are capable of obtaining an in-plane matrix of 256×256 over a field of view of 256 mm, to yield an in-plane resolution of 1×1 mm². This might typically be achieved using a repetition time (TR) of 4 ms. During this time, signal read-out would occupy about 1 ms of the 4 ms TR interval. To obtain in-plane resolution of 0.125×0.125 mm² with the same FOV, requires increasing the in-plane matrix to 2048×2048, i.e. a linear increase in resolution along each direction of a factor of 4. Under the assumption that gradient strength for signal read-out could not be increased, the requirement is that the signal read-out time be extended by a factor of 4, and additionally that the signal preparation time would also increase. Conventionally, the TR would likely increase to 8-10 ms from 4 ms. For most scanner conditions, this would be too long an interval to sustain a viable SSFP signal, making the increased resolution unattainable. However, the prior art SWIFT could be used to reduce the TR by effectively splitting-up the signal read out into several sections. In brief, SWIFT (U.S. patent application Ser. No. 12/006,540, incorporated by reference herein) applies several gradient waveforms in successive TR intervals to achieve a long signal read-out by obtaining smaller sections of each k-space line during each TR interval. In this way, the signal read-out time could be split over three TR periods, with each TR period being of duration 6 ms. The conditions for a sustainable SSFP signal are that the effects of main field inhomogeneity are low over the TR period. While a TR of 4 ms is typically feasible over the whole body, over the smaller region targeted by CORE the inhomogeneity is expected to allow a sustainable signal using a TR of 6 ms. However, the drawback of using SWIFT, is that overall scan time is extended.

Scan Time and Resolution

The CORE approach is expected to operate optimally if scanning is completed within a breathhold period. In this case, registration between slabs does not have to additionally accommodate respiratory motion. To accomplish imaging in a breathhold time, a high degree of acceleration is required. Table 1 shows typical expected parameters when setting the field of view to 256 mm of the in-plane directions, and imaging with a segmentation factor of 20, at TR of 6 ms, and using SWIFT with three passes to acquired the long read out of signal with resolution 2048 points. Under these conditions, the number of excitations per slab is 49,152, and with the segmentation factor of 20 corresponds to 2,458 heartbeats. To bring this down to a feasible breath hold time, an acceleration factor approaching 100 has be achieved. This degree of acceleration is well beyond any single acceleration approach that is suitable for this type of data. Here consider applying MACH with an acceleration factor of 8, SCIPI with an acceleration factor of 3, and 3D MASK with an acceleration factor of 4. In combination these provide a nominal acceleration factor of 96, which would bring the scan time to 26 heartbeats. As indicated above,

TABLE 1

Coronary Artery Imaging Parameters

| Parameter | Value |
| --- | --- |
| TR | 6 ms |
| In-plane field of view | 2048 |
| Slice resolution | 8 |
| Segmentation | 20 |
| SWIFT factor | 3 |
| Number of excitations per slab | 49,152 |
| Conventional Number of Heart Beats | 2,458 |
| Cumulative Acceleration | 96 |
| Accelerated Number of Heart Beats | 26 |

Obviously, some degree of acceleration could be applied without preparing the signal with CORE, but as indicated above, the degree of acceleration is expected to be lower due to the various constraints imposed by each approach. It is estimated that signal preparation by CORE results in a net acceleration factor difference of 4. Thus, with CORE the net acceleration factor was 96, but without CORE, the net acceleration factor is expected to be 24, resulting in extending the duration from a feasible breathhold of 26 heartbeats to 104 heartbeats. Clearly, requiring some degree of respiratory compensation. While strategies are available to accommodate respiratory motion, they have two major drawbacks, 1) they reduce scan efficiency below 50% (extending the nominal scan time to higher than 208 heartbeats), and 2) the ability to register data over this extended scan time is lower than that realized under breathhold conditions, ultimately detrimentally affecting the achievable resolution. Thus, CORE allows efficient use of multiple acceleration approaches, and has potential to allow breathhold high-resolution multiple projective views of the coronary arteries.

Tomosynthesis Approach to Coronary Artery Imaging Using CORE

Figure 14A:
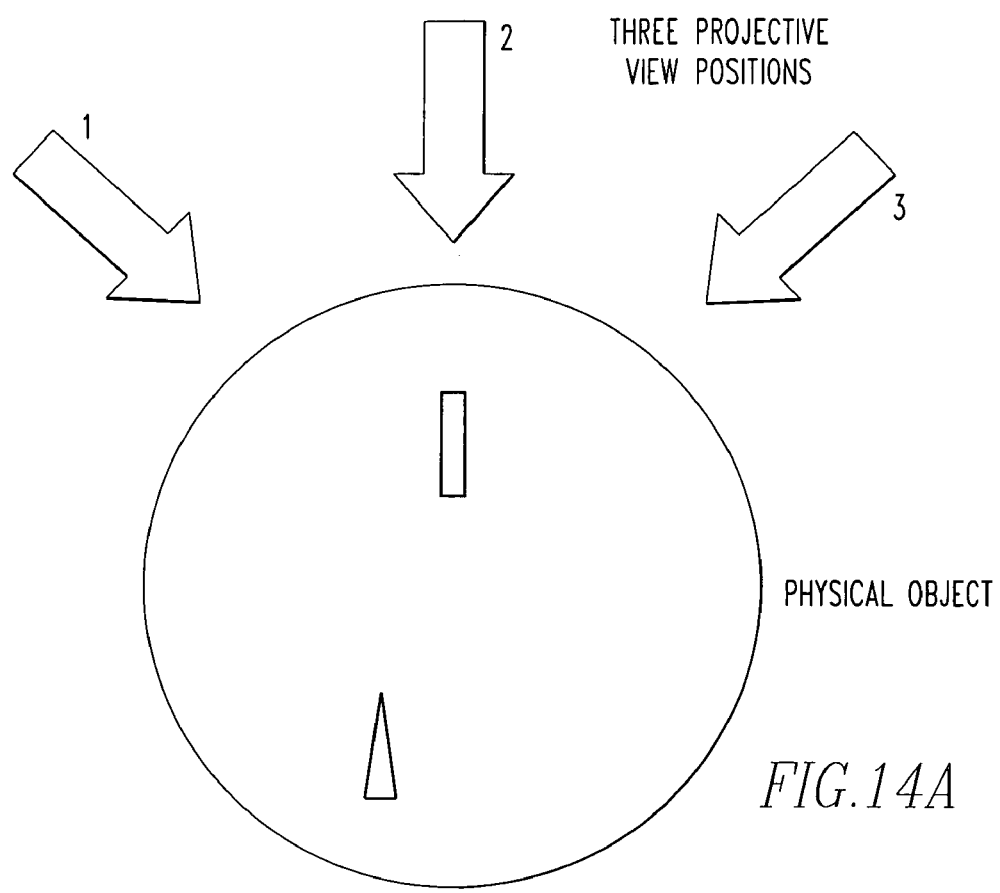
FIGS. 14a and 14b show the principle of the tomosynthesis acquisition.
Figure 14B:
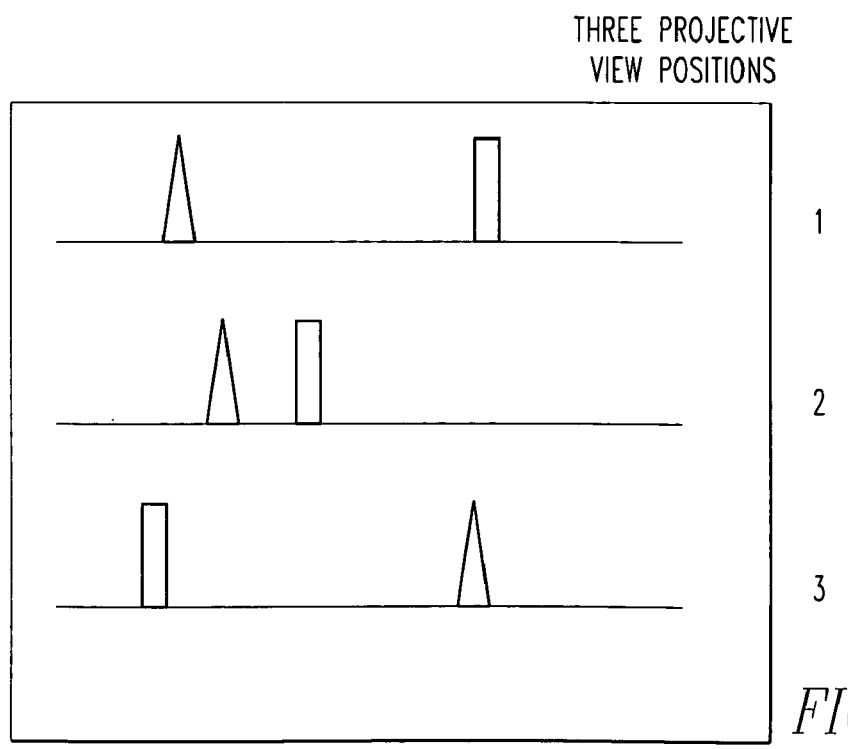

Tomosynthesis is an approach to use projective image data to better visualize projective views of features within the depth of the body, with successive view primarily focused at a specific depth within the object. To date, tomosynthesis has been mainly applied to mammography using x-ray sources. The principle of tomosynthesis is that a series of projective views of the body region are acquired, with each view being acquired at a different angle of rotation about a common point (FIG. 14). FIGS. 14a and 14b show the principle of the tomosynthesis acquisition. FIG. 14a shows the physical object and three representative viewing angles. At each view angle a projective view of the object is acquired. The respective projective views are shown in FIG. 14b. Note the relative positions of the triangular and rectangular features shift relative to each other as the view angle changes.

Figure 15A:
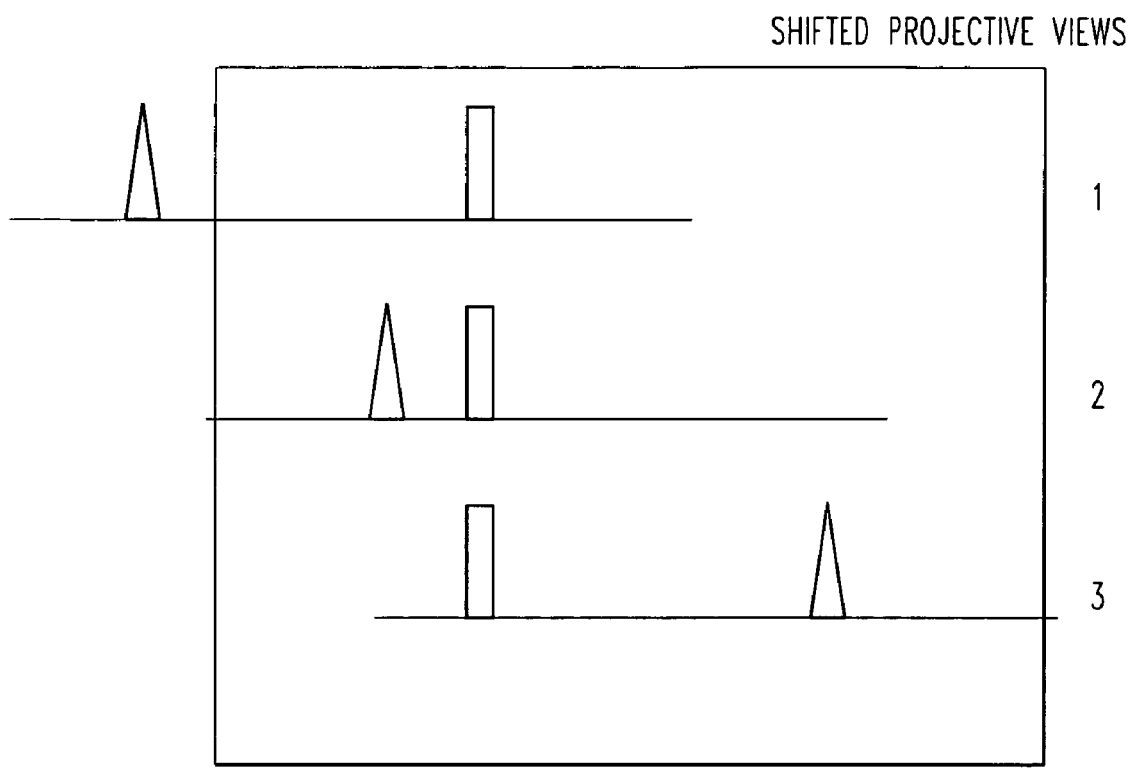
FIGS. 15a and 15b show the principle of reconstruction of tomosynthesis views.
Figure 15B:
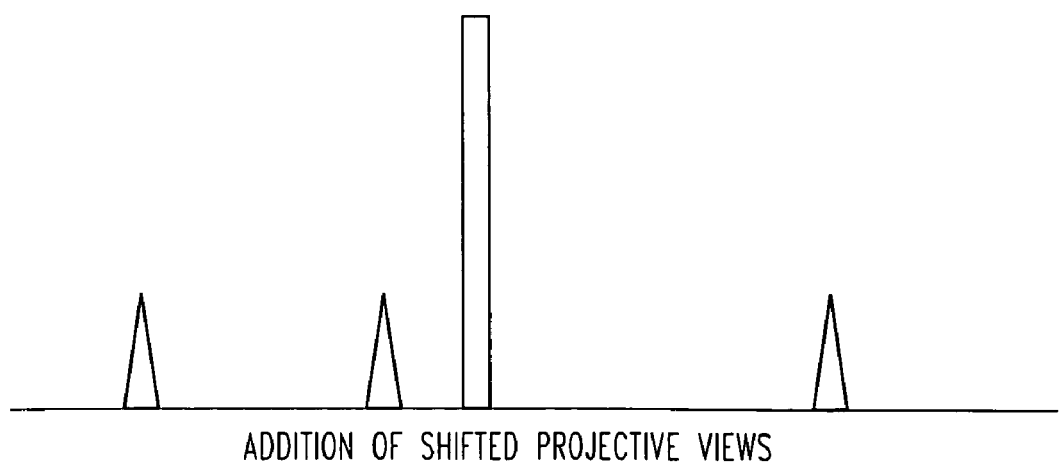

The series of projective views are digitally captured and post processing is applied to essentially focus the projective view at a specific depth within the body. In essence this is accomplished by applying a progressive translational shift to each projective view and adding the resulting data sets (FIGS. 15a and 15b). FIGS. 15a and 15b show the principle of reconstruction of tomosynthesis views. FIG. 15a shows that the three projective views of FIGS. 14a and 14b are shifted such that the rectangular features which corresponds to a certain depth in the body is aligned in each projection. FIG. 15b shows the results of adding the shifted projective views, whereby the features at the depth of the rectangle are reinforced, and other features, such as the triangle are still present but become spatially dispersed and do not reinforce. Knowledge of the angles of each view can be used to determine the shift amount for each projection to reconstruct a projection focused at specific depths within the body.

In this way, features at specific depths within the body are reinforced while other features out of this plane are de-emphasized. Thus, the view of the body region is still projective in that signal from other planes are present in each view, but the signal focusing aspect allows a view at each specific depth that is far clearer than that provided by any of the individual views. Typically, tomosynthesis is conducted using views acquired over a limited angular extent (e.g. 45 degrees) and with a set of views far less than are required for tomographic imaging.

To make CORE data suitable for application of tomosynthesis the following variation could be applied. The cylindrical region is imaged at a very poor resolution along the projective dimension, even going to the extent of not performing any spatial encoding along the projective dimension and thus producing a full slab projection at each view angle. The disadvantage of not performing any spatial encoding is that destructive interference, related to phase shifts occurring across the body caused by magnetic field inhomogeneities, may reduce the signal. The advantage of performing a limited amount of phase encoding is that projective views could be generated by adding the partially resolved signals, and without suffering significant destructive interference. In either case, the end result is that a series of projective views, encompassing the coronary arteries and surrounding structures, are obtained at a series of angles. Typically, the coronary arteries would not be prominent in any given projective view due to being obscured by signal from overlaying structures. For a series of views encompassing, say, 45 degrees, applying the progressive displacement and projective view addition processing for tomosynthesis, a series of views focused at different depths within the body can be formed. When the depth is set at the level of the coronary arteries for a particular region, then the projective data will be dominated by the signal from the coronary arteries, with other structures such as the cardiac chamber blood pool contributing proportionately lower signal levels.

Tomosynthesis works best if the range of view angles is relatively small, with 45 degrees being typical. If projective views covering a much larger angle were available, it is likely that a selection of contiguous projective views could be processed in batches to view the coronary arteries from different angles. It is also possible that the selection of projective views subjected to tomosynthesis could overlap to create a continuum of projective views of the coronary arteries.

The basic CORE excitation and acquisition strategy is ideal for tomosynthesis since data are naturally presented at a number of view angles, and the outer tissue signal is already partially distributed and blurred in the manner of tomosynthesis.

The ability to produce multiple high-resolution projective views of the coronary arteries with resolution approaching that of current x-ray angiography is of great benefit. The MRI procedure is non-invasive, in that no catheter is introduced into the body, no radiation is applied, and no contrast agent is administered. Thus, it provides the ability to obtain non-invasive data as an alternative to x-ray angiography, and which has potential to approach or achieve the established resolution requirements that are useful for clinical evaluation of the coronary arteries. The CORE approach is not restricted to viewing the coronary arteries and could be used to rapidly obtain images and views of other vessels such as the aorta.

The CORE approach incorporates slab excitation and image encoding procedures, and essentially prepares the signal and data such that image encoding can proceed efficiently. The data from CORE are prepared such that multiple acceleration approaches can be efficiently combined to acquire scan data rapidly. In this respect, CORE has a closer affinity to slice and volume selection than it does to imaging approaches. However, one feature that distinguished CORE from other volume selection approaches is that the outside of the volume of interest, the CORE signal is lower, but not absent, as it typically the case. Other approaches to inner volume imaging (i.e. preferentially exciting a region remote from the surface of the body) tend to rely on application of a series of excitation patterns, the signal from which is only isolated by combined multiple data sets at the post processing stage. These approaches are generally not applicable to steady-state-free-precession, and are more typically based on the spin, gradient, or stimulated echo approaches. One such approach is ISIS.

Approaches that aim to produce projective angiographic views of the vasculature (usually not the coronary vasculature) typically do so by directly acquiring projective views. In terms of k-space, these projective views correspond to acquisition lines that pass through the center of k-space. Typically, several such lines are acquired, all passing through the center of k-space. In CORE, k-space is imaged in a 3D manner, such that a cuboid region of k-space is sampled for each slab.

Although the invention has been described in detail in the foregoing embodiments for the purpose of illustration, it is to be understood that such detail is solely for that purpose and that variations can be made therein by those skilled in the art without departing from the spirit and scope of the invention except as it may be described by the following claims.

The invention claimed is:

1. A method for analyzing a patient comprising the steps of:
imaging a first steady state free precession excitation slab with respect to a first position regarding a target during a first repetition time;
forming a first 3-D dataset of the target associated with the first excitation slab;
imaging a second steady-state free precession excitation slab with respect to a second position different from the first position regarding the target during a second repetition time;
forming a second 3-D image dataset of the target associated with the second excitation slab;
providing the first 3-D image dataset and the second 3-D image dataset, together defining a series of 3-D image datasets for each repetition time to a computer; and
producing an image of the target by the computer from the series of 3-D image datasets.

2. The method as described in claim 1 wherein the step of imaging the second excitation slab includes the step of imaging the second excitation slab rotated about a center of the target relative to the first excitation slab.

3. The method as described in claim 2 including the step of imaging additional excitation slabs rotated about a center of the target, which together with the first and second excitation slabs, defines a series of excitation slabs.

4. A method as described in claim 3 including the step of exciting an approximately cylindrical region with a long axis of the cylindrical region disposed along one axis of the body and the circular cross section encompassing the target, and the cylindrical region is common to the series of excitation slabs.

5. A method as described in claim 4 wherein the step of exciting additional excitation slabs includes the step of arranging the series of slabs to be excited and an angle of rotation separating successive slabs in the series of slabs such that a last slab of the series is one uniform rotation step separated from the first slab.

6. A method as described in claim 5 including the step of repeating for each cycle of successive cycles an identical pattern of the series of slabs.

7. A method as described in claim 6 including the step of acquiring during each cycle at least one line of k-space data for each time point within the cycle.

8. A method as described in claim 7 including the step of maintaining encoding gradients at a constant axes while the slabs are rotating.

9. A method as described in claim 8 including the step of progressing periodically a phase encoding axes to better align with the slab at a given time.

10. A method as described in claim 9 including the step of rotating the k-space data to achieve registration between successive slabs.

11. A method as described in claim 10 including the step of mapping each k-space data set onto a uniform grid by taking a smallest sampling interval in k-space as a uniform grid size.

\* \* \* \* \*